US012775418B2

(12) United States Patent
Wang

(10) Patent No.: US 12,775,418 B2
(45) Date of Patent: *Oct. 27, 2026

(54) ROW HAMMER ATTACK ALERT

(71) Applicant: Micron Technology, Inc., Boise, ID (US)

(72) Inventor: Kai Wang, Shanghai (CN)

(73) Assignee: Micron Technology, Inc., Boise, ID (US)

( * ) Notice: Subject to any disclaimer, the term of this patent is extended or adjusted under 35 U.S.C. 154(b) by 46 days.

This patent is subject to a terminal disclaimer.

(21) Appl. No.: 18/501,897

(22) Filed: Nov. 3, 2023

(65) Prior Publication Data

US 2024/0061619 A1 Feb. 22, 2024

Related U.S. Application Data

(63) Continuation of application No. 17/746,767, filed on May 17, 2022, now Pat. No. 11,868,661.

(51) Int. Cl.

| | |
|---|---|
| ***G06F 3/06*** | (2006.01) |
| ***G11C 11/406*** | (2006.01) |
| ***G11C 11/408*** | (2006.01) |

(52) U.S. Cl.

CPC .......... *G06F 3/0659* (2013.01); *G06F 3/0604* (2013.01); *G06F 3/0679* (2013.01); *G11C 11/406* (2013.01); *G11C 11/408* (2013.01)

(58) Field of Classification Search

CPC .... G06F 3/0659; G06F 3/0604; G06F 3/0679; G11C 11/406; G11C 11/408

See application file for complete search history.

(56) References Cited

U.S. PATENT DOCUMENTS

| | | | | |
|---|---|---|---|---|
| 11,868,661 | B2 | 1/2024 | Wang | |
| 12,314,389 | B2 | 5/2025 | Wang et al. | |
| 2016/0118132 | A1* | 4/2016 | Prins | G06F 11/076 714/704 |
| 2019/0073161 | A1 | 3/2019 | Nale | |
| 2019/0073473 | A1 | 3/2019 | Vanderleest | |
| 2021/0020223 | A1* | 1/2021 | Ayyapureddi | G11C 11/40622 |
| 2021/0049269 | A1 | 2/2021 | Ghosh et al. | |
| 2021/0183433 | A1 | 6/2021 | Jenkinson et al. | |
| 2021/0349995 | A1 | 11/2021 | Qureshi | |

(Continued)

*Primary Examiner* — Mark A Giardino, Jr.

(74) *Attorney, Agent, or Firm* — Greenberg Traurig

(57) ABSTRACT

An apparatus having counters for sub-addresses in segments of row address to count activation commands applied to row addresses including the sub-addresses. The counters are configured to count activation commands applied to row addresses containing the sub-addresses in accessing rows of memory cells in a memory device; For example, in response to an activation command applied to a row address having first sub-addresses, counts stored in a portion of the counters corresponding to the first sub-addresses are increased for the count of the activation command. For each respective segment, counts stored in counters for sub-addresses in the respective segment are used to determine whether at least one of the sub-addresses has seen more activation commands than a threshold. An alert is generated for risk mitigation operations in response to each segment having at least one sub-address that has seen more activation commands than the threshold.

21 Claims, 6 Drawing Sheets

(56) References Cited

U.S. PATENT DOCUMENTS

| | | | | |
|---|---|---|---|---|
| 2021/0398584 | A1* | 12/2021 | Devaux | G11C 29/783 |
| 2022/0121398 | A1* | 4/2022 | Nale | G11C 11/408 |
| 2022/0189537 | A1 | 6/2022 | Kim | |
| 2023/0128653 | A1 | 4/2023 | You | |
| 2023/0161496 | A1 | 5/2023 | Jung et al. | |
| 2023/0178140 | A1 | 6/2023 | Cho | |
| 2023/0205428 | A1 | 6/2023 | Kim et al. | |
| 2023/0376241 | A1 | 11/2023 | Wang | |
| 2023/0409708 | A1 | 12/2023 | Wang et al. | |

* cited by examiner

ROW HAMMER ATTACK ALERT

RELATED APPLICATIONS

The present application is a continuation application of U.S. patent application Ser. No. 17/746,767 filed May 17, 2022, the entire disclosures of which application are hereby incorporated herein by reference.

TECHNICAL FIELD

At least some embodiments disclosed herein relate to memory systems in general, and more particularly, but not limited to memory systems susceptible to row hammer attack.

BACKGROUND

A memory sub-system can include one or more memory devices that store data. The memory devices can be, for example, non-volatile memory devices and volatile memory devices. In general, a host system can utilize a memory sub-system to store data at the memory devices and to retrieve data from the memory devices.

BRIEF DESCRIPTION OF THE DRAWINGS

The embodiments are illustrated by way of example and not limitation in the figures of the accompanying drawings in which like references indicate similar elements.

DETAILED DESCRIPTION

Figure 1:
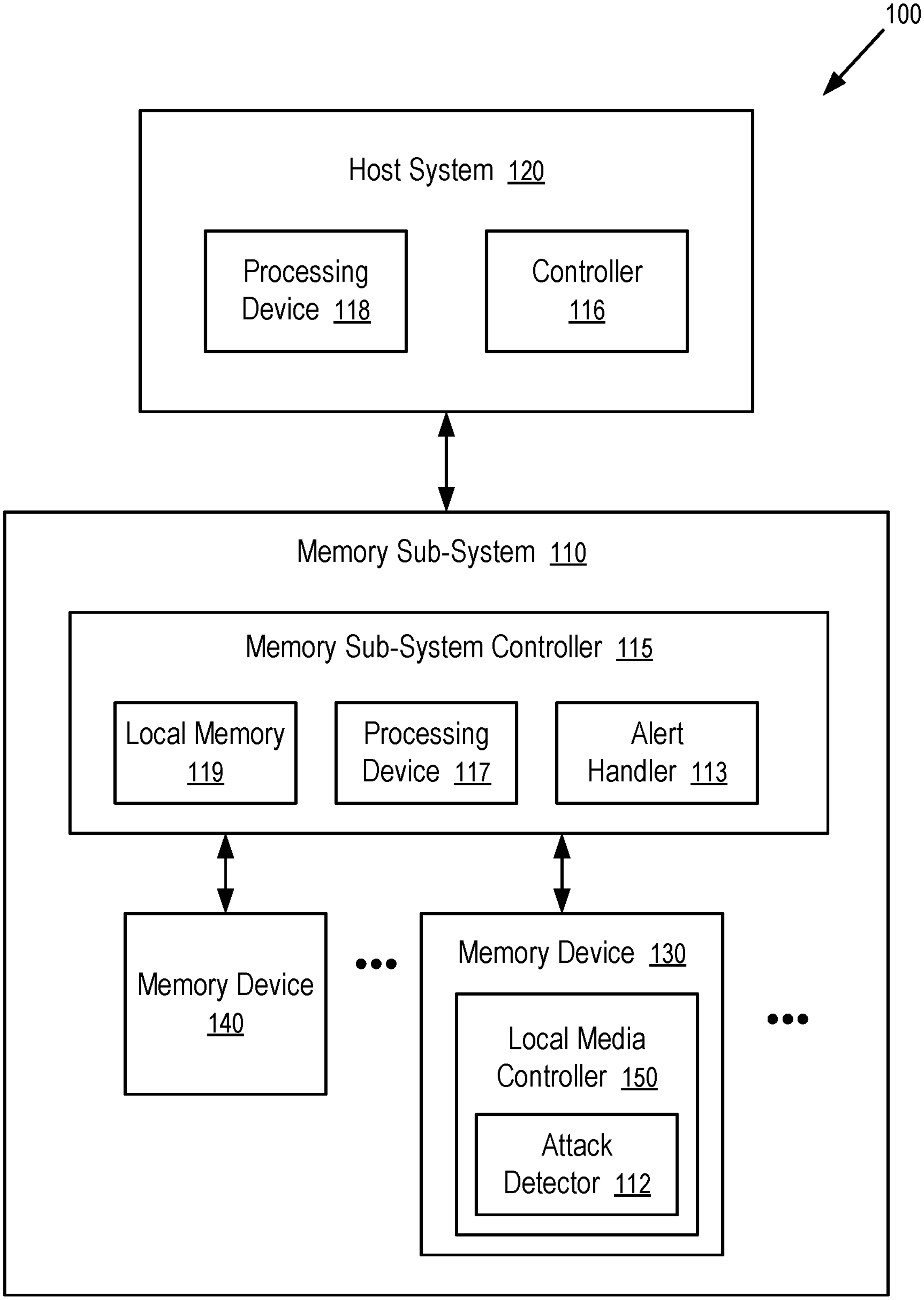
FIG. 1 illustrates an example computing system having a memory sub-system in accordance with some embodiments of the present disclosure.

At least some aspects of the present disclosure are directed to the detection of row hammer attacks by monitoring row activation commands based on segments of row address. Examples of storage devices and memory modules are described below in conjunction with FIG. 1. In general, a host system can utilize a memory sub-system that includes one or more components, such as memory devices that store data. The host system can provide data to be stored at the memory sub-system and can request data to be retrieved from the memory sub-system.

Row hammer is an activity of repeatedly toggling the wordline of a row using an activation command. Such activities can cause deterioration in the integrity of data stored in some types of memory cells, such as dynamic random access memory (DRAM). For example, to read DRAM, an activation command can be used to raise the voltage applied on a wordline and to connect cells on an addressed row to a bitline. Excessive activation commands applied on a row of memory cell stress the effects of inter-cell coupling on nearby rows, causing some of the cells to leak charge at an accelerated rate. If such a cell loses too much charge before it is restored to its original value via a refresh command, it can provide an erroneous result when being read. Hackers or users may deliberately or inadvertently trigger a row hammer attack, which may place the system in risk. It is desirable to detect such attacks, especially in applications that have safety implications, such as automotive applications. For example, row hammer attack can induce multiple bit failures which may not be detected and/or corrected using an error correction code (ECC) technique. Hence, detecting potential row hammer attacks to apply appropriate coping strategies can be important to safety.

Row hammer attack can be detected via counting the numbers of activation commands addressed to each row. If a row is over-activated within a refresh window, further activation commands for the row can be rejected or discarded. However, when a memory component has a large number of rows, a large amount resources can be used in the counting of activation commands for each row. Alternatively, a probabilistic-based detection method may be used. However, such a method can fail under certain attack sequences.

At least some aspects of the present disclosure address the above and other deficiencies by detecting row hammer attack in separate address segments. When all of the address segments reports a row hammer attack, an alert is generated. For example, a row address has n bits. Thus, to monitor the entire address to detect row hammer attack, activation commands received at each address are counted using a counter. Thus, $2^n$ counters are used to monitor the entire address. To reduce the number of counters used, the n-bit row address can be partitioned into m segments, each having n/m bits. Each segment can be monitored in a same way as monitoring the entire address. When there is a row hammer attack, each of the segments will report a count of activation commands above a threshold. Thus, the system can use the condition of whether each of the segments has a report of row hammer attack in the respective segment to detect a row hammer attack. Monitoring each segment uses $2^{n/m}$ counters; and monitoring the m segments uses $m \times 2^{n/m}$ counters, which are significantly fewer than $2^n$ counters as the number of partition m increases.

In general, such technique of monitoring address segments can detect row hammer attacks and generate false alarms. When each segment has an address portion that has seen at least a threshold number of activation commands, the combination of the address portions are not necessarily from a same address of activation commands. Increasing the number of partition m can increase the probability of false alarms.

The technique of monitoring address segments for row hammer attacks can identify potential suspected attack activities with a limited hardware overhead. The monitoring can be implemented on a DRAM-bank basis.

After each segment reports a positive detection of row hammer attack, an alert can be generated and asserted to start risk mitigation. The alert can be set in multiple levels, including a system level. The risk mitigation operation can be application-specific. Optionally, multiple levels of threshold can be implemented. For example, when a level of threshold triggers an alert, such an alert represents a type of alarms associated with a predetermined risk mitigation strategy to be deployed as a response to such a type of alarms. For example, when a first threshold count of activation commands triggers a first alert, first operations implementing a first risk mitigation strategy are performed in response to the first alert; subsequently, when more activation commands are counted and a second threshold count of activation commands, more than the first threshold count, triggers a second alert, second operations implementing a second risk mitigation strategy are performed in response to the second alert. More than two levels of threshold can be used. Such multi-level alerts can gradually and smoothly ramp up counter measures for risk mitigation, since a counter measure can degrade the performance of the system to a degree. Using the multiple level approach can trigger an appropriate risk mitigation operation at an early stage of a potential attack.

For example, the memory device or the memory sub-system can dynamically adjust the refresh rate to prevent data loss or corruption. For example, increasing the refresh rate can accelerate the refresh cycle so that rows of memory cells under potential attacks can be refreshed sooner before activation commands applied on the physically neighbor rows after a refresh reach a threshold. For example, one or more refresh commands can be scheduled and performed in response to the alert.

Optionally, the memory device or the memory sub-system can dynamically throttle access traffic (e.g., page-switching operations) targeting the bank for which the alert is generated. For example, the memory device or the memory sub-system can limit/control the flow at an early stage (e.g., corresponding to a lower threshold), and completely block the flow at a later stage (e.g., corresponding to a higher threshold).

Optionally, in response to the alert, the system can reload mission critical data (e.g., by retrieving such data from memory and writing the data back to the memory). Examples of mission critical data can include data related to authority management, automotive safety, etc.

Optionally, a mission critical program can run multiple concurrent, redundant threads; and the common result from most threads can be selected for use. Such an approach can be effective when row hammer attacks do not cause same changes in computing results from the redundant threads.

FIG. 1 illustrates an example computing system 100 that includes a memory sub-system 110 in accordance with some embodiments of the present disclosure. The memory sub-system 110 can include media, such as one or more volatile memory devices (e.g., memory device 140), one or more non-volatile memory devices (e.g., memory device 130), or a combination of such.

In general, a memory sub-system 110 can be a storage device, a memory module, or a hybrid of a storage device and memory module. Examples of a storage device include a solid-state drive (SSD), a flash drive, a universal serial bus (USB) flash drive, an embedded multi-media controller (eMMC) drive, a universal flash storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, a laptop computer, a network server, a mobile device, a vehicle (e.g., airplane, drone, train, automobile, or other conveyance), an internet of things (IoT) enabled device, an embedded computer (e.g., one included in a vehicle, industrial equipment, or a networked commercial device), or such a computing device that includes memory and a processing device.

The computing system 100 can include a host system 120 that is coupled to one or more memory sub-systems 110. FIG. 1 illustrates one example of a host system 120 coupled to one memory sub-system 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

For example, the host system 120 can include a processor chipset (e.g., processing device 118) and a software stack executed by the processor chipset. The processor chipset can include one or more cores, one or more caches, a memory controller (e.g., controller 116) (e.g., NVDIMM controller), and a storage protocol controller (e.g., PCIe controller, SATA controller). The host system 120 uses the memory sub-system 110, for example, to write data to the memory sub-system 110 and read data from the memory sub-system 110.

The host system 120 can be coupled to the memory sub-system 110 via a physical host interface. Examples of a physical host interface include, but are not limited to, a serial advanced technology attachment (SATA) interface, a peripheral component interconnect express (PCIe) interface, a universal serial bus (USB) interface, a fibre channel, a serial attached SCSI (SAS) interface, a double data rate (DDR) memory bus interface, a small computer system interface (SCSI), a dual in-line memory module (DIMM) interface (e.g., DIMM socket interface that supports double data rate (DDR)), an open NAND flash interface (ONFI), a double data rate (DDR) interface, a low power double data rate (LPDDR) interface, or any other interface. The physical host interface can be used to transmit data between the host system 120 and the memory sub-system 110. The host system 120 can further utilize an NVM express (NVMe) interface to access components (e.g., memory devices 130) when the memory sub-system 110 is coupled with the host system 120 by the PCIe interface. The physical host interface can provide an interface for passing control, address, data, and other signals between the memory sub-system 110 and the host system 120. FIG. 1 illustrates a memory sub-system 110 as an example. In general, the host system 120 can access multiple memory sub-systems via a same communication connection, multiple separate communication connections, and/or a combination of communication connections.

The processing device 118 of the host system 120 can be, for example, a microprocessor, a central processing unit (CPU), a processing core of a processor, an execution unit, etc. In some instances, the controller 116 can be referred to as a memory controller, a memory management unit, and/or an initiator. In one example, the controller 116 controls the communications over a bus coupled between the host system 120 and the memory sub-system 110. In general, the controller 116 can send commands or requests to the memory sub-system 110 for desired access to memory devices 130, 140. The controller 116 can further include interface circuitry to communicate with the memory sub-system 110. The interface circuitry can convert responses received from the memory sub-system 110 into information for the host system 120.

The controller 116 of the host system 120 can communicate with the controller 115 of the memory sub-system 110 to perform operations such as reading data, writing data, or erasing data at the memory devices 130, 140 and other such operations. In some instances, the controller 116 is integrated within the same package of the processing device 118. In other instances, the controller 116 is separate from the package of the processing device 118. The controller 116 and/or the processing device 118 can include hardware such as one or more integrated circuits (ICs) and/or discrete components, a buffer memory, a cache memory, or a combination thereof. The controller 116 and/or the processing device 118 can be a microcontroller, special purpose logic circuitry (e.g., a field programmable gate array (FPGA), an application specific integrated circuit (ASIC), etc.), or another suitable processor.

The memory devices 130, 140 can include any combination of the different types of non-volatile memory components and/or volatile memory components. The volatile memory devices (e.g., memory device 140) can be, but are not limited to, random access memory (RAM), such as dynamic random access memory (DRAM) and synchronous dynamic random access memory (SDRAM).

Some examples of non-volatile memory components include a negative-and (or, NOT AND) (NAND) type flash memory and write-in-place memory, such as three-dimensional cross-point ("3D cross-point") memory. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Each of the memory devices 130 can include one or more arrays of memory cells. One type of memory cell, for example, single level cells (SLC) can store one bit per cell. Other types of memory cells, such as multi-level cells (MLCs), triple level cells (TLCs), quad-level cells (QLCs), and penta-level cells (PLCs) can store multiple bits per cell. In some embodiments, each of the memory devices 130 can include one or more arrays of memory cells such as SLCs, MLCs, TLCs, QLCs, PLCs, or any combination of such. In some embodiments, a particular memory device can include an SLC portion, an MLC portion, a TLC portion, a QLC portion, and/or a PLC portion of memory cells. The memory cells of the memory devices 130 can be grouped as pages that can refer to a logical unit of the memory device used to store data. With some types of memory (e.g., NAND), pages can be grouped to form blocks.

Although non-volatile memory devices such as 3D cross-point type and NAND type memory (e.g., 2D NAND, 3D NAND) are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), spin transfer torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory sub-system controller 115 (or controller 115 for simplicity) can communicate with the memory devices 130 to perform operations such as reading data, writing data, or erasing data at the memory devices 130 and other such operations (e.g., in response to commands scheduled on a command bus by controller 116). The controller 115 can include hardware such as one or more integrated circuits (ICs) and/or discrete components, a buffer memory, or a combination thereof. The hardware can include digital circuitry with dedicated (i.e., hard-coded) logic to perform the operations described herein. The controller 115 can be a microcontroller, special purpose logic circuitry (e.g., a field programmable gate array (FPGA), an application specific integrated circuit (ASIC), etc.), or another suitable processor.

The controller 115 can include a processing device 117 (processor) configured to execute instructions stored in a local memory 119. In the illustrated example, the local memory 119 of the controller 115 includes an embedded memory configured to store instructions for performing various processes, operations, logic flows, and routines that control operation of the memory sub-system 110, including handling communications between the memory sub-system 110 and the host system 120.

In some embodiments, the local memory 119 can include memory registers storing memory pointers, fetched data, etc. The local memory 119 can also include read-only memory (ROM) for storing micro-code. While the example memory sub-system 110 in FIG. 1 has been illustrated as including the controller 115, in another embodiment of the present disclosure, a memory sub-system 110 does not include a controller 115, and can instead rely upon external control (e.g., provided by an external host, or by a processor or controller separate from the memory sub-system).

In general, the controller 115 can receive commands or operations from the host system 120 and can convert the commands or operations into instructions or appropriate commands to achieve the desired access to the memory devices 130. The controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The controller 115 can further include host interface circuitry to communicate with the host system 120 via the physical host interface. The host interface circuitry can convert the commands received from the host system into command instructions to access the memory devices 130 as well as convert responses associated with the memory devices 130 into information for the host system 120.

The memory sub-system 110 can also include additional circuitry or components that are not illustrated. In some embodiments, the memory sub-system 110 can include a cache or buffer (e.g., DRAM) and address circuitry (e.g., a row decoder and a column decoder) that can receive an address from the controller 115 and decode the address to access the memory devices 130.

In some embodiments, the memory devices 130 include local media controllers 150 that operate in conjunction with the memory sub-system controller 115 to execute operations on one or more memory cells of the memory devices 130. An external controller (e.g., memory sub-system controller 115) can externally manage the memory device 130 (e.g., perform media management operations on the memory device 130). In some embodiments, a memory device 130 is a managed memory device, which is a raw memory device combined with a local controller (e.g., local media controller 150) for media management within the same memory device package. An example of a managed memory device is a managed NAND (MNAND) device.

A memory device 130 and/or the controller 115 can include an attack detector 112 to generate an alert in response to each address segment having seen more than a threshold number of activation commands observed at a location. The controller 115 can include an alert handler 113 configured to perform risk mitigation operations in response to the alert. In some embodiments, the controller 115 and/or the memory device 130 in the memory sub-system 110 includes at least a portion of the alert handler 113. In other embodiments, or in combination, the controller 116 and/or the processing device 118 in the host system 120 includes at least a portion of the alert handler 113. For example, the controller 115, the controller 116, and/or the processing device 118 can include logic circuitry implementing the alert handler 113. For example, the controller 115, or the processing device 118 (processor) of the host system 120, can be configured to execute instructions stored in memory for performing the operations of the alert handler 113 described herein. In some embodiments, the alert handler 113 is implemented in an integrated circuit chip disposed in the memory sub-system 110. In other embodiments, the alert handler 113 can be part of firmware of the memory sub-system 110, an operating system of the host system 120, a device driver, or an application, or any combination therein.

For example, a row address can be partitioned into multiple segments as sub-addresses. The attack detector 112 is configured to count, for each sub-address separately, activation commands applied to an address containing the sub-address. An address segment can have different sub-addressed; and when the highest count of activation commands is above a threshold for the sub-addresses in an address segment, a flag is raised for the address segment. When each of the address segments has a raised flag, the attack detector 112 generates an alert. In response, the alert handler 113 performs risk mitigation operations to defeat the attack. The attack detector 112 resets its counters after the alert is handled, or in response to a new refresh cycle that can include multiple refresh commands issued to a bank of memory cells.

In general, different address segments can have different widths. A width of an address segment can be the number of address bits contained in the segment. Optionally, some address segments can share address bits (e.g., so that all address segments have a same width).

The techniques of monitoring activation commands based on address segments have the advantageous of reducing hardware overhead in implementing the attack detector 112. The detection is not based on a probabilistic approach. The attack detector 112 does not generate false negative, although it can generate false positive.

Increasing the number of address segments can reduce hardware resources used to implement the attack detector 112 but increases false alerts. Adjusting the number of address segments configured for the attack detector 112 can adjust the trade-off between resource efficiency and false alerts. For example, the address segment number can be adjusted such that when the memory device 130 is used in a typical application, probability of a "false alert" is low.

Locality of memory access in applications, as well as operations of caching, high bandwidth utilization scheduling policies implemented by memory controller can decrease page switching operations and thus the likelihood of false alerts.

Figure 2:
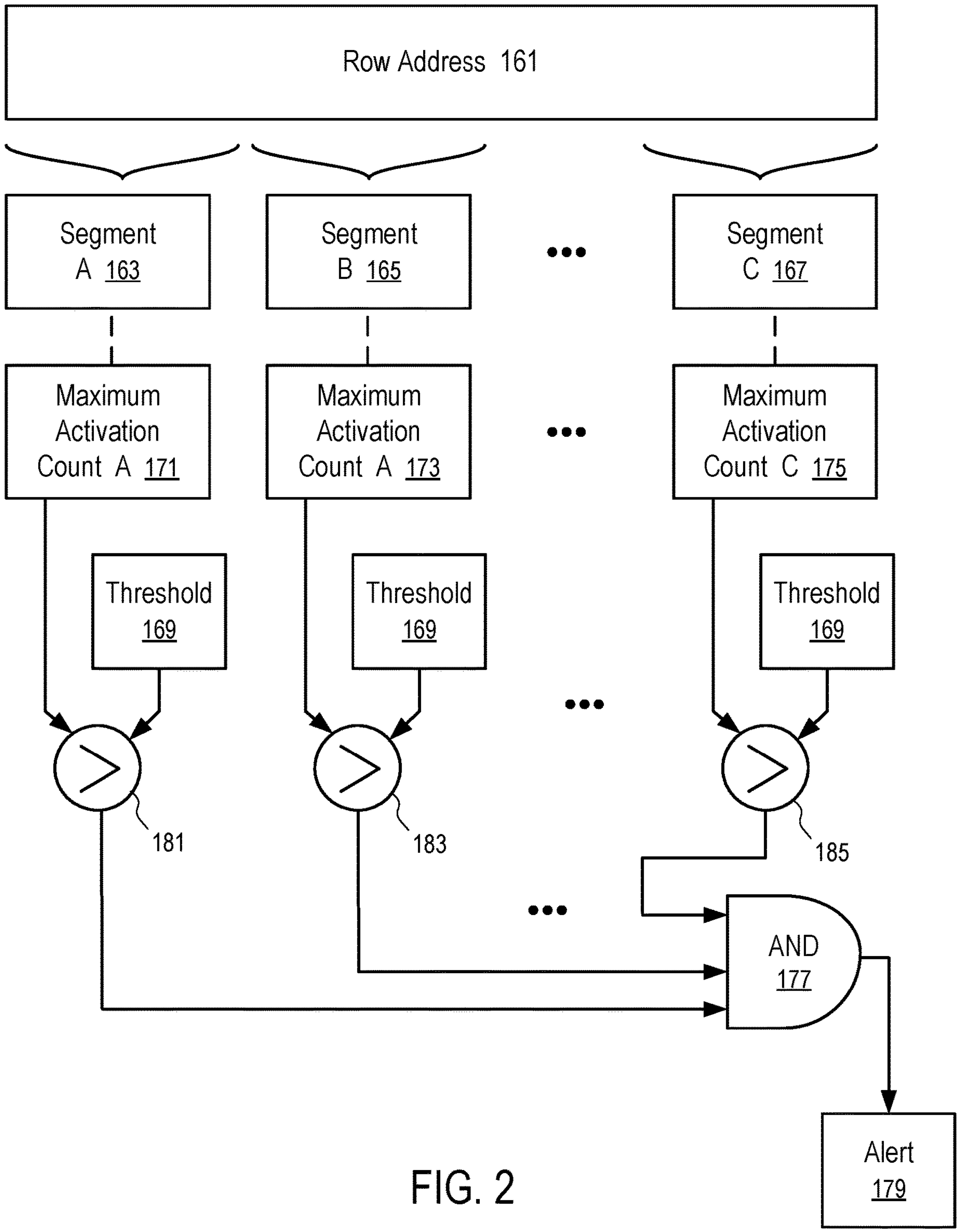
FIG. 2 shows a technique to generate a row hammer attack alert based on counting activation commands for segments of row address according to one embodiment.

FIG. 2 shows a technique to generate a row hammer attack alert based on counting row activation commands for segments of row address according to one embodiment.

For example, the technique of FIG. 2 can be used by the attack detector 112 in FIG. 1 to generate alerts about potential row hammer attacks.

In FIG. 2, a row address 161 is usable to identify a row of memory cells in a memory device 130 (e.g., as in FIG. 1). Each individual row of memory cells in the memory device 130 has a unique row address 161. Different row addresses (e.g., 161) represent different rows in the memory device 130.

Instead of counting activation commands applied to each row address 161, activation commands are counted for address segments 163, 165, . . . , 167 of the row address 161.

For example, the row address 161 in a binary format has a number of bits. Each of the segments 163, 165, . . . , 167 can be sub-address having a subset of the bits of the row address 161.

For example, the bits of the row address 161 can be divided for the segments 163, 165, . . . , 167 according to a predetermined scheme. In one implementation, each of the segments 163, 165, . . . , 167 has a same number of bits extracted from the bits of the row address 161. Optionally, some of the segments 163, 165, . . . , 167 can share one or more bits (e.g., so that each of the segments 163, 165, . . . , 167 has a same number of bits). In another implementation, some of the segments 163, 165, . . . , 167 have different numbers of bits.

When an activation command is applied for a row of memory cells having the row address 161, an attack detector 112 using the technique of FIG. 2 increases, by one, the counts of activation commands for the sub-addresses of the row address 161 in the segments 163, 165, . . . , 167 respectively.

Different addresses (e.g., 161) can have different sub-addressed in the same segment (e.g., 163, 165, or 167). Thus, each segment (e.g., 163) has counters for different sub-addresses to count the activation commands applied to row addresses (e.g., 161) having the corresponding sub-addresses in the segment (e.g., 163). The maximum count stored in the counters for the segment (e.g., 163, 165, . . . , or 167) is determined as a maximum activation count (e.g., 171, 173, . . . , or 175) for the respectively segments (e.g., 163, 165, . . . , or 167). Further details are discussed below in connection with FIG. 3.

The maximum activation counts 171, 173, . . . , 175 are each compared to a threshold 169. Each of the comparators 181, 183, . . . , 185 is configured to output 1 to indicate that the respective maximum activation count (e.g., 171, 173, . . . , or 175) is above the threshold 169. When each of the comparators 181, 183, . . . , 185 outputs 1, the logic operation AND 177 produces an output representative an alert 179.

For example, when the number of activation commands applied to the row address 161 is above a threshold, the maximum activation counts 171, 173, . . . , 175 for the segments 163, 165, . . . , 167 are at least equal to or above the number of activation commands applied to the row address 161. Thus, the alert 179 can be generated for the alert handler 113 (e.g., as in FIG. 1) to perform risk mitigation operations, as discussed above in connection with FIG. 1.

For example, the alert handler 113 implemented in the memory device 130 and/or the memory sub-system 110 can increase the frequency to refresh memory cells in the memory device 130 according to a time period between the instance of the alert 179 being generated and the most recent instance of resetting the counters and the maximum activation counts 171, 173, . . . , 175 for the segments 163, 165, . . . , 167. For example, the frequency can be adjusted such that the time gap between two successive refreshing of a same row is shorter than the time period between the item of the alert 179 and the item of most recent refreshing before the alert 179.

Optionally, the alert handler 113 can perform a refresh in response to the alert 179 without changing the frequency for subsequent refreshing. Alternatively, in response to the alert 179, the alert handler 113 can perform a refresh and increase the frequency to partially close the difference between the time gap between two successive refreshing and the time period between the item of the alert 179 and the item of most recent refreshing before the alert 179. If there is a subsequent alert 179, such a difference can be further closed via adjusting the refreshing frequency.

Optionally, in absence of an alert 179 for a period time of using the memory device 130, the previously increased refreshing frequency can be lowered for improved memory performance.

Optionally, the alert handler 113 implemented in the memory device 130 or the memory sub-system 110 can throttle memory access traffic towards a memory bank in the memory device 130 in which the alert 179 is generated. For example, the alert 179 is generated, at least one sub-address in each segment has a count of activation commands above the threshold. Combinations of such sub-addresses from the segments 163, 165, . . . , 167 can provide one or more candidates of row addresses (e.g., 161) that may have seen activation commands more than the threshold 169. The rate of data access directed to a group of row addresses (e.g., corresponding to a bank of memory cells) can be decreased to reduce the activation commands in the group of row addresses.

Optionally, in response to the alert 179, an alert handler implemented in the host system 120 can reload mission critical data (e.g., by retrieving such data from the memory device 130 and writing the data back to the memory device 130). Examples of mission critical data can include data related to authority management, automotive safety, etc.

Optionally, in response to the alert 179, an alert handler implemented in a mission critical application can run multiple concurrent, redundant threads of computation using multiple redundant copies of data stored in memory devices (e.g., 130, . . . , 140). Each result generated by a thread can be considered a vote for the result; and a common result having most votes can be used by the mission critical application.

Figure 3:
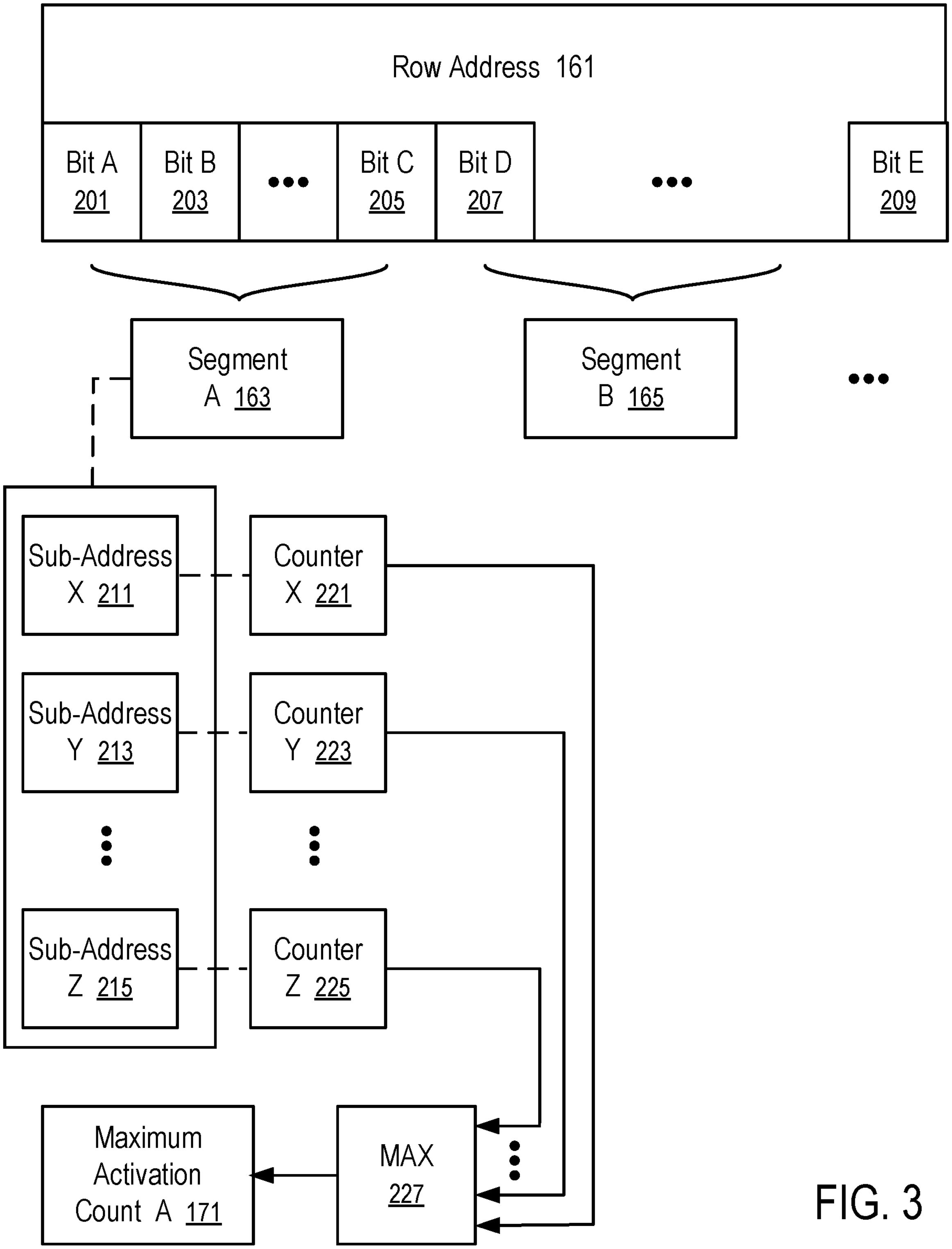
FIG. 3 shows a technique to determine a maximum activation count for an address segment according to one embodiment.

FIG. 3 shows a technique to determine a maximum activation count for an address segment according to one embodiment.

For example, the maximum activation counts 171, 173, . . . , 175 can be generated using the technique of FIG. 3.

In FIG. 3, the row address 161 in a binary format has bits 201, 203, . . . , 205, 207, . . . , 209. A segment 163 of the row address 161 has a number of bits 201, 203, . . . , 205. The number of bits 201, 203, . . . , 205 as extracted from the row address 161 from a sub-address (e.g., 211, 213, . . . , or 215). Different sub-addresses (e.g., 211, 213, . . . , 215) are extracted from different row addresses (e.g., 161) from the same segment. A plurality of counters 221, 223, . . . , 225 are configured to monitor the plurality of sub-addresses (e.g., 211, 213, . . . , 215).

For example, when an activation command is applied to a row address (e.g., 161) having a sub-address (e.g., 211, 213, or 215) in the segment 163, the corresponding counter (e.g., 221, 223, or 225) is incremented by one for the sub-address (e.g., 211, 213, or 215).

An operation MAX 227 is configured to determine the maximum activation count 171 among the counts stored in the counters 221, 223, . . . , 225 for the segment 163. The maximum activation count 171 can be compared to a threshold 169 to generate an indication of whether a row hammer attack is detected based on the segment 163, as in FIG. 2.

The counters 221, 223, . . . , 225 can be reset in response to a refresh command or periodically according to a time interval of refresh command. If an alert 179 is generated, the counters 221, 223, . . . , 225 can be reset after the alert handler 113 completes its operations to mitigate risks of data loss or corrupting resulting from excessive activation commands applied to a row of memory cells.

Figure 4:
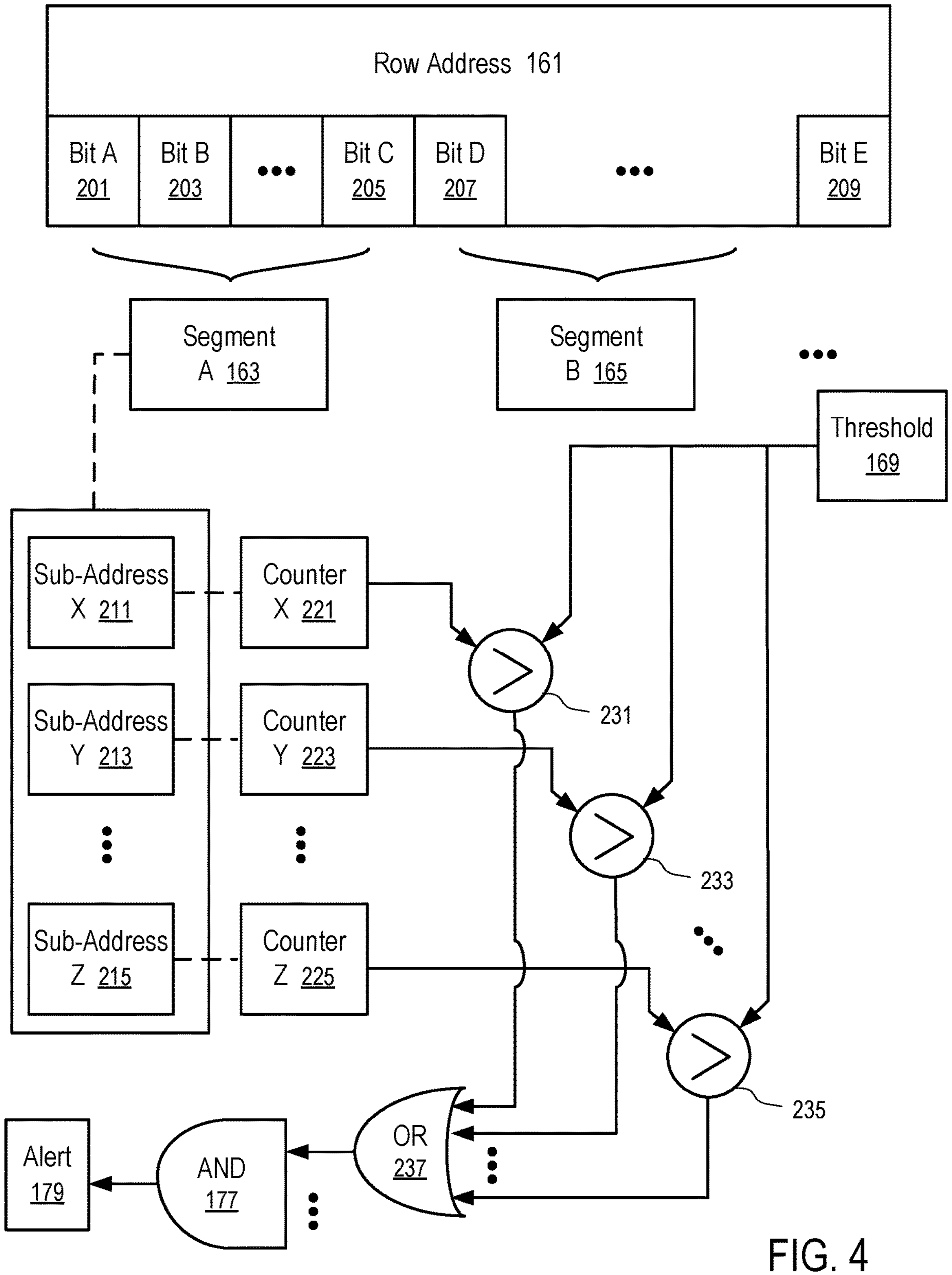
FIG. 4 shows another technique to generate a row hammer attack alert according to one embodiment.

FIG. 4 shows another technique to generate a row hammer attack alert according to one embodiment.

Similar to the technique in FIG. 3, an attack detector 112 using the technique of FIG. 4 uses counters 221, 223, . . . , 225 to count activation commands applied to row addresses (e.g., 161) having sub-addresses 211, 213, . . . , 215 in the segment 163.

Instead of using an operation MAX 227 as in FIG. 3 to determine a maximum for comparison to a threshold 169, the counts stored in the counters 221, 223, . . . , 225 are compared in FIG. 4 to the threshold 169 directly using comparators 231, 233, . . . , 235 to generate indications of whether each of the sub-addresses 211, 213, . . . , 215 is experiencing a potential row hammer attack. A logic operation OR 237 combines the outputs of the comparators 231, 233, . . . , 235 to generate an indication of whether the segment 163 is experiencing a row hammer attack. Similar to the use of a logic operation AND 177 in FIG. 2, indications of whether the segment 163, 165, . . . , 167 of row address can be combined using the logic operation AND 177 to generate an alert 179 only when each of the segments 163, 165, . . . , 167 is experiencing a row hammer attack.

Figure 5:
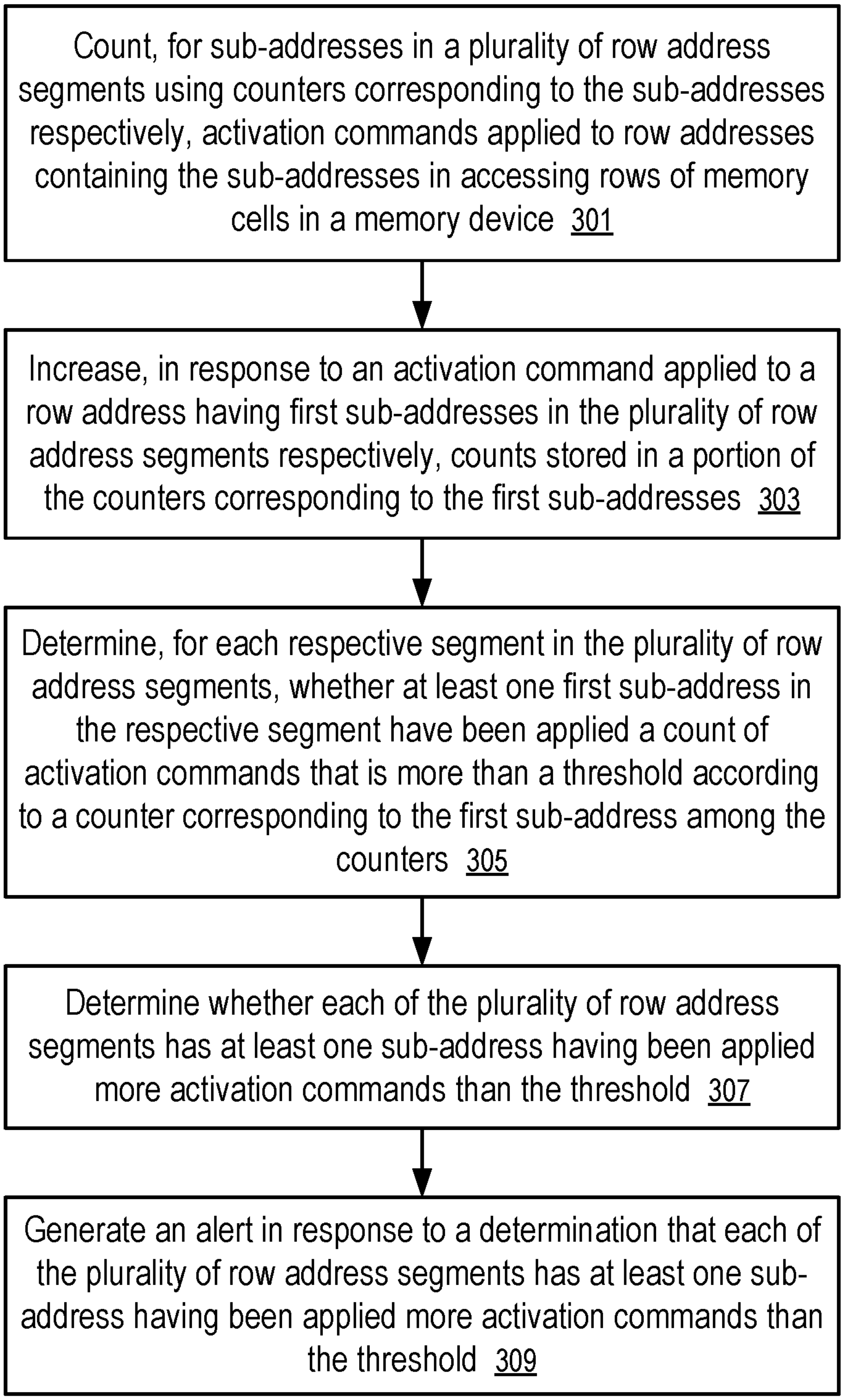
FIG. 5 shows a method to secure data integrity based on a row hammer attack alert according to one embodiment.

FIG. 5 shows a method to secure data integrity based on a row hammer attack alert according to one embodiment.

For example, the attack detector 112 and/or the alert handler 113 of FIG. 1 implemented using techniques of FIG. 2 to FIG. 4 can use the method of FIG. 5.

At block 301, an attack detector 112 counts, for sub-addresses (e.g., 211, 213, . . . , 215) in a plurality of row address segments (e.g., 163, 165, . . . , 167) using counters (e.g., 221, 223, . . . , 225) corresponding to the sub-addresses (e.g., 211, 213, . . . , 215) respectively, activation commands applied to row addresses (e.g., 161) containing the sub-addresses (e.g., 211, 213, . . . , 215) in accessing rows of memory cells in a memory device 130.

For example, each respective row address (e.g., 161) used in the memory device 130 during a read operation has a predetermined number of bits (e.g., 201, 203, . . . 209) in a binary format of the respective row address (e.g., 161). Each respective segment (e.g., 163) represents a predetermined subset of the bits (e.g., 201, 203, . . . 205).

Optionally, the segments 163, 165, . . . , 167 have a same size such that each of the plurality of row address segments 163, 165, . . . , 167 has a same number of bits (e.g., 201, 203, . . . , 205) from the respective row address 161. Alternatively, a first segment (e.g., 163) among the plurality of row address segments 163, 165, . . . , 167 has a first number of bits (e.g., 201, 203, . . . , 205) from the respective row address 161; a second segment (e.g., 165) among the plurality of row address segments 163, 165, . . . , 167 has a second number of bits (e.g., 207, . . . ) from the respective row address 161; and the first number is different from the second number.

At block 303, the counters (e.g., 221, 223, . . . , 225) increase, in response to an activation command applied to a row address (e.g., 161) having first sub-addresses (e.g., 211) in the plurality of row address segments (e.g., 163) respectively, counts stored in a portion of the counters (e.g., 221) corresponding to the first sub-addresses (e.g., 211).

At block 305, the attack detector 112 can determine, for each respective segment (e.g., 163) in the plurality of row address segments 163, 165, . . . , 167, whether at least one first sub-address in the respective segment have been applied a count of activation commands that is more than a threshold 169 according to a counter corresponding to the first sub-address (e.g., 211) among the counters (e.g., 221, 223, . . . , 225).

For example, as in FIG. 2 and FIG. 3, the attack detector 112 can have a logic circuit (e.g., MAX 227) configured to determine a maximum activation count 171 among counts stored in counters 221, 223, . . . , 225 corresponding to sub-addresses 211, 213, . . . , 215 in a first segment 163 among the plurality of row address segments 163, 165, . . . , 167. The attack detector 112 can have a comparator (e.g., 181) configured to compare the maximum activation count 171 with the threshold 169 to determine whether the first segment 163 has at least one sub-address having been applied more activation commands than the threshold.

For example, as in FIG. 4, the attack detector 112 can have comparators (e.g., 231, 233, . . . , 235) each configured to compare the threshold 169 with each respective count stored in a respective counter (e.g., 221, 223, . . . , or 225) corresponding to a sub-address (e.g., 211, 213, . . . , 215) in a first segment (e.g., 163) among the plurality of row address segments (e.g., 163, 165, . . . , 167). The attack detector 112 can have a logic circuit (e.g., AND 177) configured to determine, from results of the comparators (e.g., 231, 233, . . . , 235), whether the first segment 163 has at least one sub-address having been applied more activation commands than the threshold.

At block 307, the attack detector 112 determines whether each of the plurality of row address segments has at least one sub-address having been applied more activation commands than the threshold 169.

At block 309, the attack detector 112 generates an alert 179 in response to a determination that each of the plurality of row address segments has at least one sub-address having been applied more activation commands than the threshold 169.

For example, in response to the alert 179, an alert handler 113 can perform a risk mitigation operation, such as: starting a memory refresh operation in the memory device 130; adjusting a frequency of memory refresh operations in the memory device 130; throttling memory access towards row addresses related to sub-addresses having been applied excessive activation commands; reloading data in the memory device 130; or starting multiple redundant threads of computation based on redundant copies of data in the memory device 130; or any combination thereof.

The attack detector 112 can reset the counters (e.g., 221, 223, . . . , 225) periodically in absence of an alert. For example, the attack detector 112 can reset the counters (e.g., 221, 223, . . . , 225) in response to each refresh command executed in the memory device 130.

Figure 6:
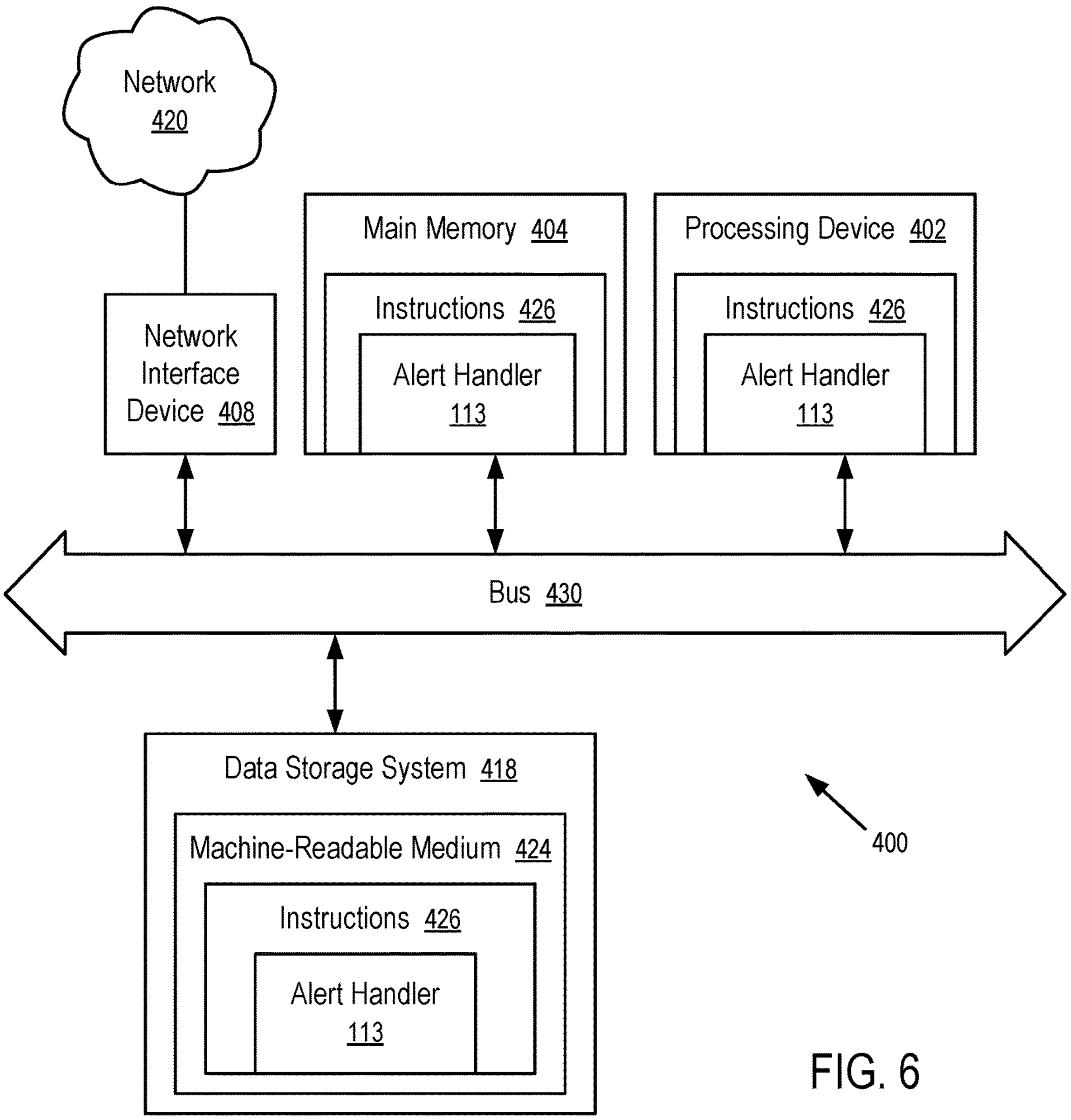
FIG. 6 is a block diagram of an example computer system in which embodiments of the present disclosure can operate.

FIG. 6 illustrates an example machine of a computer system 400 within which a set of instructions, for causing the machine to perform any one or more of the methodologies discussed herein, can be executed. In some embodiments, the computer system 400 can correspond to a host system (e.g., the host system 120 of FIG. 1) that includes, is coupled to, or utilizes a memory sub-system (e.g., the memory sub-system 110 of FIG. 1) or can be used to perform the operations of an alert handler 113 (e.g., to execute instructions to perform operations corresponding to the alert handler 113 described with reference to FIG. 1-FIG. 5). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a personal digital assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 400 includes a processing device 402, a main memory 404 (e.g., read-only memory (ROM), flash memory, dynamic random access memory (DRAM) such as synchronous DRAM (SDRAM) or Rambus DRAM (RDRAM), static random access memory (SRAM), etc.), and a data storage system 418, which communicate with each other via a bus 430 (which can include multiple buses).

Processing device 402 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 402 can also be one or more special-purpose processing devices such as an application specific integrated circuit (ASIC), a field programmable gate array (FPGA), a digital signal processor (DSP), network processor, or the like. The processing device 402 is configured to execute instructions 426 for performing the operations and steps discussed herein. The computer system 400 can further include a network interface device 408 to communicate over the network 420.

The data storage system 418 can include a machine-readable medium 424 (also known as a computer-readable medium) on which is stored one or more sets of instructions 426 or software embodying any one or more of the methodologies or functions described herein. The instructions 426 can also reside, completely or at least partially, within the main memory 404 and/or within the processing device 402 during execution thereof by the computer system 400, the main memory 404 and the processing device 402 also constituting machine-readable storage media. The machine-readable medium 424, data storage system 418, and/or main memory 404 can correspond to the memory sub-system 110 of FIG. 1.

In one embodiment, the instructions 426 include instructions to implement functionality corresponding to an alert handler 113 (e.g., the alert handler 113 described with reference to FIG. 1-FIG. 5). While the machine-readable medium 424 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general purpose computer selectively activated or reconfigured by a computer program stored in the computer. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In this description, various functions and operations are described as being performed by or caused by computer instructions to simplify description. However, those skilled in the art will recognize what is meant by such expressions is that the functions result from execution of the computer instructions by one or more controllers or processors, such as a microprocessor. Alternatively, or in combination, the functions and operations can be implemented using special purpose circuitry, with or without software instructions, such as using application-specific integrated circuit (ASIC) or field-programmable gate array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A device, comprising:

rows of memory cells, wherein a row of the rows of memory cells has a row address;

a counter configured to count activation commands applied to sub-addresses in the row address of the row;

a logic circuit configured to generate, using the counter, an alert about a row hammering attack.

2. The device of claim 1, wherein each activation command applied to the row address is to cause an increase in more than one counter among a plurality of counters.

3. The device of claim 1, further comprising a plurality of counters, wherein each respective counter among the plurality of counters is configured to count activation commands applied to respective row addresses containing a sub-address pre-associated with each respective counter of the plurality of counters.

4. The device of claim 3, wherein the plurality of counters includes a subset of first counters; and sub-addresses pre-associated with the first counters correspond to a first row address.

5. The device of claim 4, wherein the device is configured to compare a value in each of the first counters with a threshold; and the alert is generated in response to each of the first counters having the value exceeding the threshold.

6. The device of claim 4, wherein the device is configured to determine a maximum value among values in the first counters; and the alert is generated in response to the maximum value exceeding a threshold.

7. The device of claim 3, wherein the plurality of counters include a subset of first counters each pre-associated with a combination of bit values in a predetermined segment of bits in the row address; and the alert is generated based at least in part one of the first counters having a value greater than a threshold.

8. The device of claim 3, wherein sub-addresses pre-associated with the plurality of counters are configured to have a same number of bits.

9. The device of claim 3, wherein the logic circuit is further configured to perform, in response to the alert, a risk mitigation operation.

10. The device of claim 9, wherein the risk mitigation operation includes:

starting a memory refresh operation in the device;

adjusting a frequency of memory refresh operations in the device;

throttling memory access towards row addresses related to sub-addresses having been applied excessive activation commands;

reloading data in the device; or starting multiple redundant threads of computation based on redundant copies of data in the device; or any combination thereof.

11. The device of claim 3, wherein the logic circuit is further configured to reset the counter periodically in absence of an alert, or in response to a refresh command.

12. The device of claim 1, wherein the sub-addresses refer to only a subset of bits in the row.

13. A system, comprising:

rows of memory cells addressable via row addresses;

counters corresponding to sub-addresses in row address segments, wherein each respective counter in the counters is configured to count activation commands applied to row addresses having a sub-address corresponding to the respective counter, wherein the sub-address refers to only a subset of a given row of the rows; and a processing device configured to perform risk mitigation operations based on values in the counters.

14. The system of claim 13, wherein the processing device is further configured to:

determine, for each respective segment in a plurality of segments, whether at least one first sub-address in the respective segment have been applied a count of activation commands that is more than a threshold according to a counter corresponding to the first sub-address among the counters;

determine whether each of the plurality of row address segments has at least one sub-address having been applied more activation commands than the threshold; and generate an alert in response to a determination that each of the plurality of row address segments has at least one sub-address having been applied more activation commands than the threshold.

15. The system of claim 14, wherein in response to the alert, the processing device is configured to:

start a memory refresh operation in the rows of memory cells;

adjust a frequency of memory refresh operations in the rows of memory cells;

throttle memory access towards row addresses related to sub-addresses having been applied excessive activation commands;

reload data in the rows of memory cells; or start multiple redundant threads of computation based on redundant copies of data in the rows of memory cells; or any combination thereof.

16. A method, comprising:

counting, using a plurality of counters that are pre-associated with sub-addresses of row addresses of memory cells, activation commands applied to sub-addresses, wherein each of the sub-addresses refers to only a subset of a given row associated with the row addresses; and generating, based on values in the counters, an alert about row hammering attack.

17. The method of claim 16, wherein each activation command applied to a row address is to cause an increase in more than one counter among the counters.

18. The method of claim 17, further comprising:

performing, in response to the alert, a risk mitigation operation.

19. The method of claim 18, wherein the risk mitigation operation includes:

starting a memory refresh operation;

adjusting a frequency of memory refresh operations;

throttling memory access towards row addresses related to sub-addresses having been applied excessive activation commands;

reloading data; or starting multiple redundant threads of computation based on redundant copies of data in the memory cells; or any combination thereof.

20. The method of claim 19, wherein sub-addresses pre-associated with the counters are configured to have a same number of bits.

21. The method of claim 20, further comprising:

resetting the counters periodically in absence of an alert, or in response to a refresh command.

* * * * *